US012696730B2

(12) United States Patent
Takao et al.

(10) Patent No.: US 12,696,730 B2
(45) Date of Patent: Jul. 28, 2026

(54) SUSCEPTOR AND METHOD FOR MANUFACTURING NITRIDE SEMICONDUCTOR LIGHT-EMITTING ELEMENT

(71) Applicant: NIKKISO CO., LTD., Tokyo (JP)

(72) Inventors: Kazufumi Takao, Hakusan (JP); Cyril Pernot, Hakusan (JP)

(73) Assignee: Nikkiso Co., Ltd., Tokyo (JP)

( * ) Notice: Subject to any disclaimer, the term of this patent is extended or adjusted under 35 U.S.C. 154(b) by 671 days.

(21) Appl. No.: 18/157,878

(22) Filed: Jan. 23, 2023

(65) Prior Publication Data
US 2023/0246120 A1     Aug. 3, 2023

(30) Foreign Application Priority Data

Jan. 28, 2022     (JP) ................................. 2022-011364

(51) Int. Cl.
H10P 72/76     (2026.01)
H10H 20/01     (2025.01)
H10P 72/00     (2026.01)

(52) U.S. Cl.
CPC ..... H10P 72/7611 (2026.01); H10H 20/0137 (2025.01); H10P 72/0432 (2026.01); H10P 72/7618 (2026.01)

(58) Field of Classification Search
CPC .............. H10P 72/7618; H10P 72/7611; H10P 72/0432; H10H 20/0137; H10H 20/01335;

(Continued)

(56) References Cited

U.S. PATENT DOCUMENTS 5,785,764 A * 7/1998 Hoshina .................. C30B 25/12
                                                    118/728
7,381,276 B2 * 6/2008 Johnson ............ H01L 21/68728
                                                    118/724

(Continued)

FOREIGN PATENT DOCUMENTS

JP          2021-193726 A     12/2021
WO        2020071308 A1     9/2020

OTHER PUBLICATIONS

Taiwanese Official Action dated Apr. 8, 2024 received from the Taiwanese Patent Office in related TW 112101929 together with English language translation.

(Continued)

*Primary Examiner* — Eduardo A Rodela
(74) *Attorney, Agent, or Firm* — Scully, Scott, Murphy & Presser, P. C.

(57)          ABSTRACT

A susceptor includes a pocket in which a wafer is placed. A side surface of the pocket comprises a side-surface circumference portion formed in a circumference shape and a side-surface enlarged portion formed to extend toward an outer circumferential side of the pocket beyond the side-surface circumference portion. In a plan view seen from an open side of the pocket, when a straight line passing through a rotational center of the susceptor and a circumferential center of the side-surface circumference portion is defined as a first straight line and a straight line orthogonal to the first straight line and passing through the circumferential center is defined as a second straight line, the side-surface enlarged portion overlaps the second straight line.

2 Claims, 10 Drawing Sheets

(58) Field of Classification Search
CPC ......... H01L 21/68714; H01L 21/68735; H01L
21/68764; H01L 21/68771; H01L
21/68785; H01L 21/67103
See application file for complete search history.

(56) References Cited

U.S. PATENT DOCUMENTS

| | | | | |
|---|---|---|---|---|
| 9,748,113 | B2 * | 8/2017 | Armour | C23C 16/047 |
| 10,526,705 | B2 * | 1/2020 | Boyd | C23C 16/458 |
| 11,542,604 | B2 * | 1/2023 | Wu | C23C 16/46 |
| 2006/0191483 | A1 * | 8/2006 | Blomiley | C23C 16/4586 |
| | | | | 118/725 |
| 2007/0026148 | A1 * | 2/2007 | Arai | C23C 16/4585 |
| | | | | 118/728 |
| 2007/0218664 | A1 * | 9/2007 | Ito | C30B 25/12 |
| | | | | 438/565 |
| 2010/0055318 | A1 * | 3/2010 | Volf | C23C 16/46 |
| | | | | 118/500 |
| 2014/0283748 | A1 * | 9/2014 | Higashi | C30B 25/14 |
| | | | | 118/725 |
| 2021/0375663 | A1 | 12/2021 | Ikejiri | |
| 2022/0267926 | A1 * | 8/2022 | Haberecht | C30B 25/12 |

OTHER PUBLICATIONS

Official Action dated Jun. 27, 2023 received from the Japanese Patent Office in related JP 2022-011364 together with English language translation.
Taiwanese Official Action dated Nov. 21, 2023 received from the Taiwanese Patent Office in related TW 112101929 together with English language translation.
Official Action dated Feb. 14, 2023 received from the Japanese Patent Office in related JP 2022-011364 together with English language translation.

* cited by examiner

SUSCEPTOR AND METHOD FOR MANUFACTURING NITRIDE SEMICONDUCTOR LIGHT-EMITTING ELEMENT

CROSS-REFERENCE TO RELATED APPLICATIONS

The present patent application claims the priority of Japanese patent application No. 2022/011364 filed on Jan. 28, 2022, and the entire contents of Japanese patent application No. 2022/011364 are hereby incorporated by reference.

TECHNICAL FIELD

The present invention relates to a susceptor and a method for manufacturing a nitride semiconductor light-emitting element.

BACKGROUND ART

Patent Literature 1 discloses a method for manufacturing a wafer containing a group III nitride semiconductor by the Metal Organic Chemical Vapor Deposition (MOCVD) method. In the method for manufacturing a wafer described in Patent Literature 1, a substrate is placed in a pocket of a susceptor arranged in a chamber, each layer of the wafer is sequentially epitaxially grown on the substrate by introducing source gases to be raw materials of each layer of the wafer into the chamber, and the wafer is thereby manufactured.

CITATION LIST

Patent Literature

Patent Literature 1: JP 2021/193726 A

SUMMARY OF INVENTION

In case of the method for manufacturing a wafer described in Patent Literature 1, however, there is room for improvement in achieving uniform in-plane light output distribution in the wafer to be manufactured.

The invention was made in view of such circumstances and it is an object of the invention to provide a susceptor and a method for manufacturing a nitride semiconductor light-emitting element that allow to achieve uniform in-plane light output distribution in a wafer to be manufactured.

To achieve the object described above, the invention provides a susceptor, comprising:

a pocket in which a wafer is placed, wherein a side surface of the pocket comprises a side-surface circumference portion formed in a circumference shape and a side-surface enlarged portion formed to extend toward an outer circumferential side of the pocket beyond the side-surface circumference portion, and wherein in a plan view seen from an open side of the pocket, when a straight line passing through a rotational center of the susceptor and a circumferential center of the side-surface circumference portion is defined as a first straight line and a straight line orthogonal to the first straight line and passing through the circumferential center is defined as a second straight line, the side-surface enlarged portion overlaps the second straight line.

To achieve the object described above, the invention also provides a method for manufacturing a nitride semiconductor light-emitting element using the susceptor described above, the method comprising:

placing a substrate in the pocket; and epitaxially growing a semiconductor layer comprising a nitride semiconductor on the substrate while heating and rotating the susceptor.

Advantageous Effects of Invention

According to the invention, it is possible to provide a susceptor and a method for manufacturing a nitride semiconductor light-emitting element that allow to achieve uniform in-plane light output distribution in a wafer to be manufactured.

DESCRIPTION OF EMBODIMENTS

First Embodiment

The first embodiment of the invention will be described in reference to the FIGS. 1 to 6. The embodiment below is described as a preferred illustrative example for implementing the invention. Although some part of the embodiment specifically illustrates various technically preferable matters, the technical scope of the invention is not limited to such specific aspects.

(Manufacturing Apparatus 1 for Wafer W)

Figure 1:
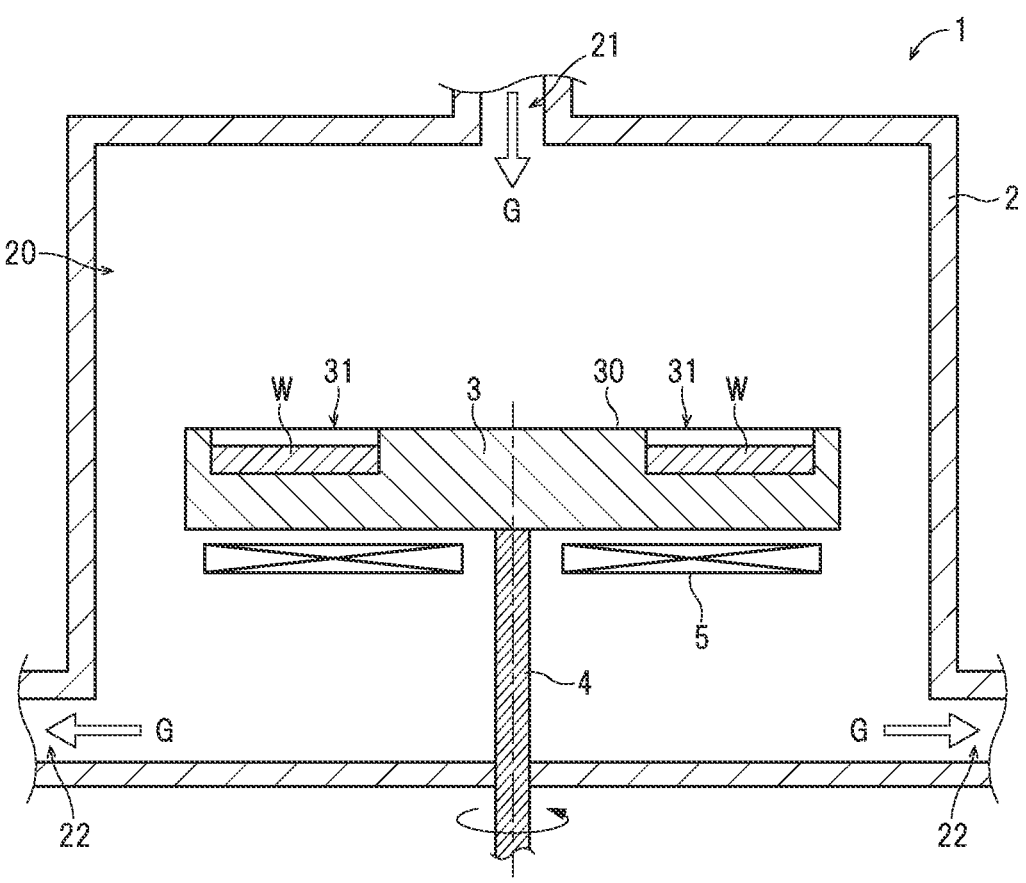
FIG. 1 is a schematic cross-sectional view showing a manufacturing apparatus for wafer in the first embodiment.

FIG. 1 is a schematic cross-sectional view showing a manufacturing apparatus 1 for a wafer W in the first embodiment. FIG. 1 also shows manufactured wafers W. In FIG. 1, the scale ratio of each constituent element is not necessarily the same as the actual scale ratio.

The manufacturing apparatus 1 is an apparatus to form plural semiconductor layers on a substrate (see the reference sing 10 in FIG. 2) of the wafer W. In the first embodiment, the manufacturing apparatus 1 is a MOCVD apparatus using the metal organic chemical vapor deposition (MOCVD) method to manufacture the wafer W. The MOCVD method is sometimes called the Metal Organic Vapor Phase Epitaxy (MOVPE) method.

The manufacturing apparatus 1 includes a reactor 2, a susceptor 3, a rotating shaft 4, and a heater 5. The reactor 2 defines a reaction chamber 20 to grow the wafer W, and includes an introduction port 21 to introduce source gases G of each semiconductor layer of the wafer W into the reaction chamber 20 and discharge ports 22 to discharge the source gases G from the reaction chamber 20. The manufacturing apparatus 1 in the first embodiment is a so-called vertical MOCVD apparatus and is configured such that the source gases G are introduced to the susceptor 3 in a thickness direction of the susceptor 3. Hereinafter, the thickness direction of the susceptor 3 (e.g., the up-and-down direction in FIG. 1) is referred to as the up-and-down direction. In addition, one side in the up-and-down direction where the introduction port 21 is located in relation to the susceptor 3 (e.g., an upper side in FIG. 1) is referred to as the upper side, and the opposite side (e.g., a lower side in FIG. 1) is referred to as the lower side. In the first embodiment, the up-and-down direction when manufacturing the wafer W by the manufacturing apparatus 1 is the vertical direction. The susceptor 3 is arranged in the reaction chamber 20 of the reactor 2.

Figure 2:
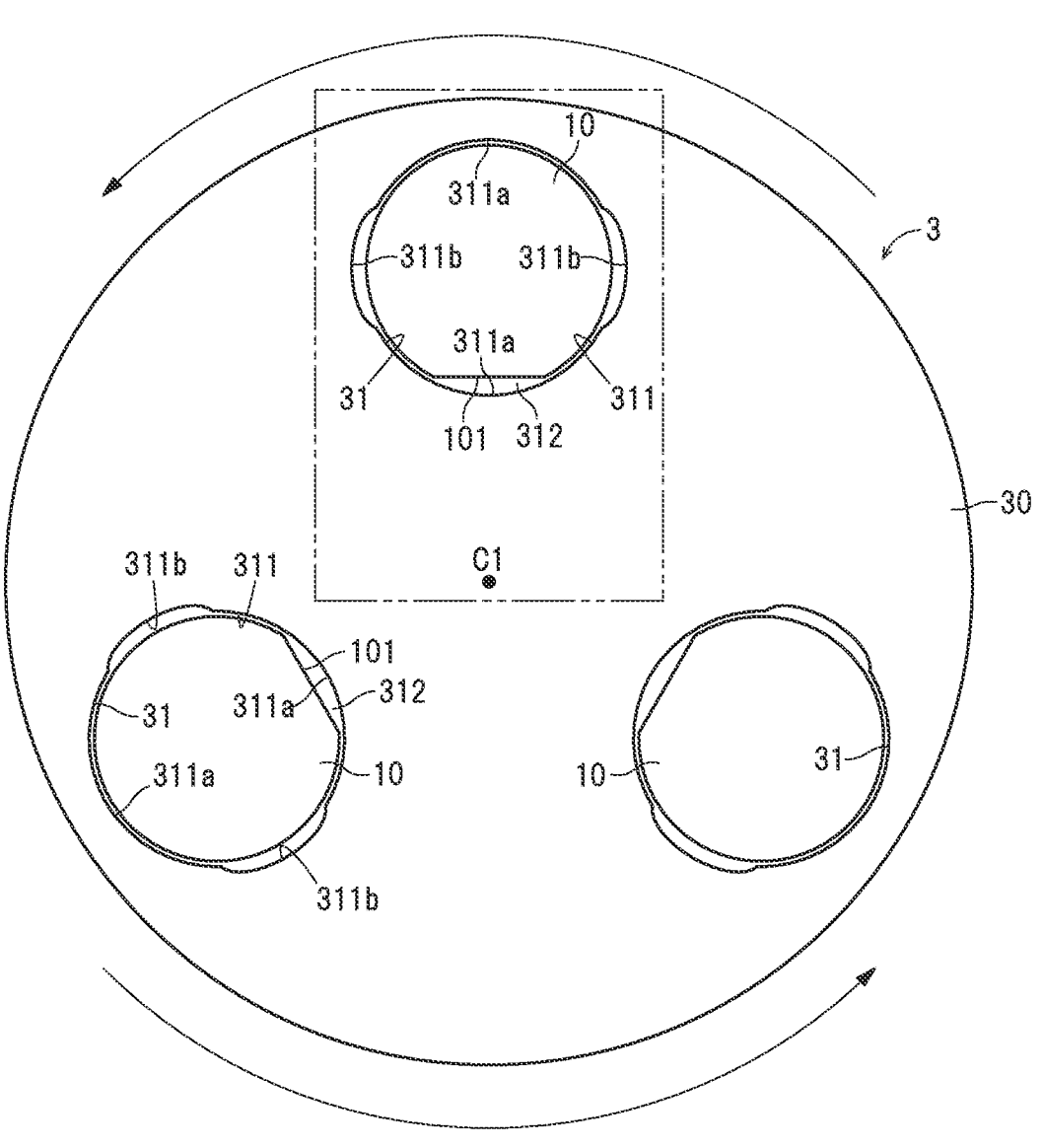
FIG. 2 is a plan view showing a susceptor and substrates in the first embodiment.

FIG. 2 is a plan view showing the susceptor 3 and the substrates 10. The susceptor 3 is made of, e.g., graphite, etc., with excellent thermal conductivity and is formed in a substantially disk shape. A pocket 31 recessed toward the lower side from an upper surface 30 of the susceptor 3 is formed on the susceptor 3. In the first embodiment, plural pockets 31 are formed on the susceptor 3. Although FIG. 2 shows an example in which three pockets 31 are provided, the number of the pockets 31 formed on the susceptor 3 is not specifically limited. The pockets 31 are arranged on the outer circumferential side of the susceptor 3 relative to a rotational center C1 of the susceptor 3. Hereinafter, the outer circumferential side of the susceptor 3 is referred to as the susceptor outer circumferential side, and an inner circumferential side of the susceptor 3 is referred to as the susceptor inner circumferential side.

Figure 3:
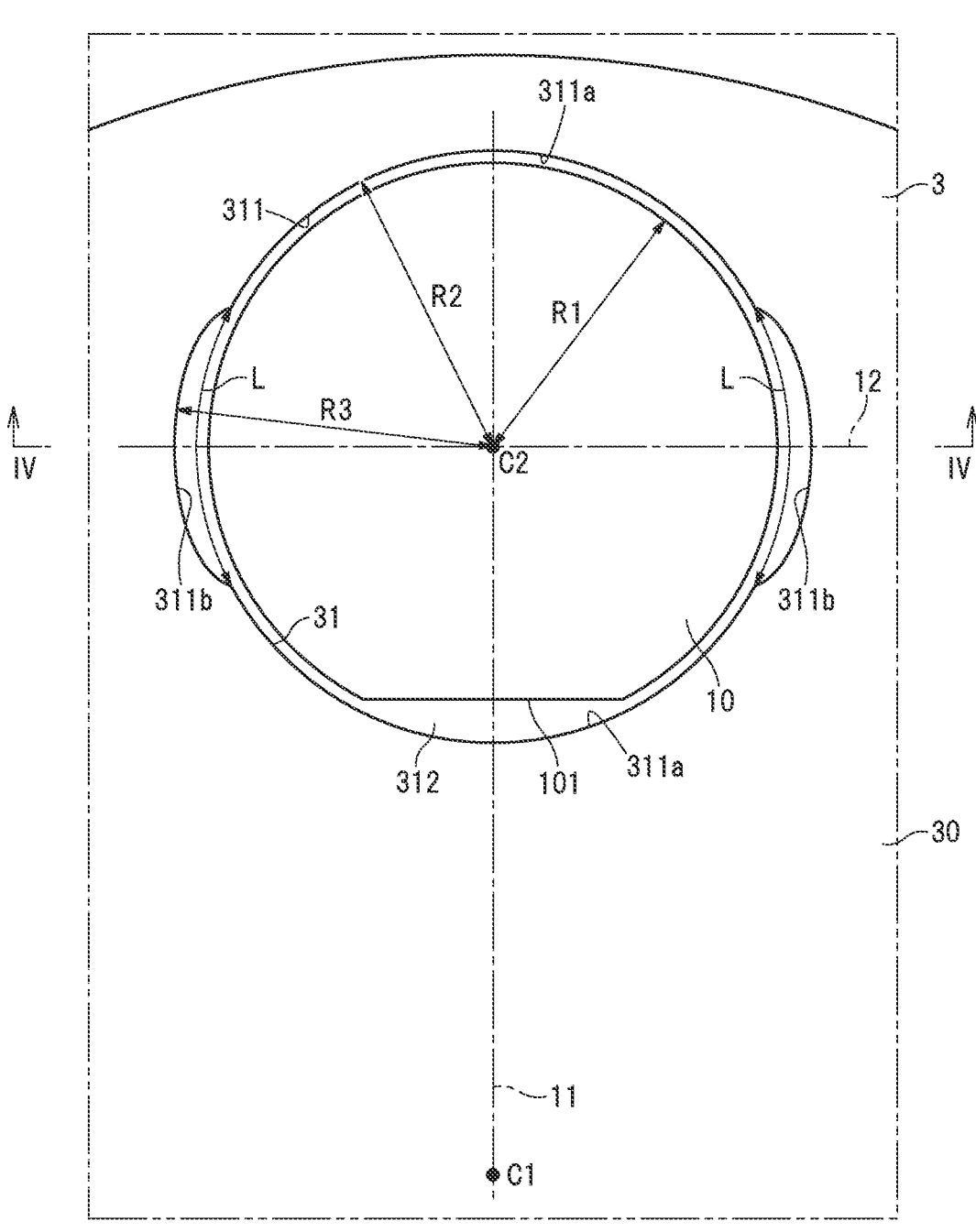
FIG. 3 is an enlarged view showing a portion surrounded by a dash-dot-dot line in FIG. 2.
Figure 4:
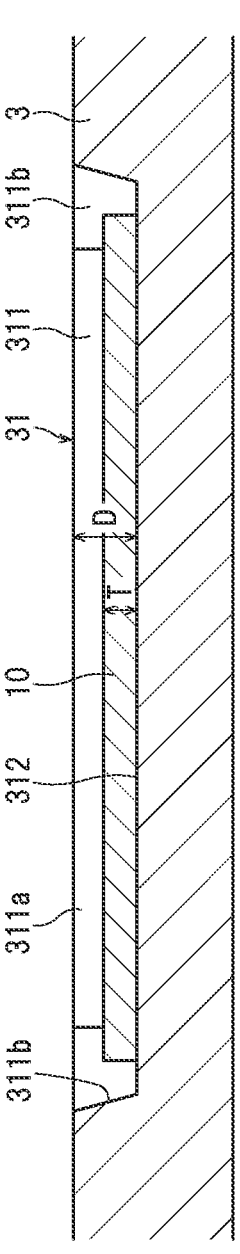
FIG. 4 is a cross-sectional view taking along line IV-IV of FIG. 3, as viewed in an arrow direction.

FIG. 3 is an enlarged view showing a portion surrounded by a dash-dot-dot line in FIG. 2. FIG. 4 is a cross-sectional view taking along line IV-IV of FIG. 3, as viewed in an arrow direction. As shown in FIG. 3, a side surface 311 of the pocket 31 has two side-surface circumference portions 311a formed in a circumference shape, and two side-surface enlarged portions 311b that connect between ends of the two side-surface circumference portions 311a and are formed to extend toward the outer circumferential side of the pocket 31 beyond the side-surface circumference portions 311a.

Each of the two side-surface circumference portions 311a is formed in an arc shape and overlaps the same virtual circle (not shown) in a plan view of the susceptor 3 seen from the upper side (hereinafter, sometimes simply referred to as "the plan view"). Hereinafter, the outer circumferential side of the pocket 31 is referred to as the pocket outer circumferential side, and an inner circumferential side of the pocket 31 is referred to as the pocket inner circumferential side.

Here, as shown in FIG. 3, a radius of the substrate 10 is defined as a radius R1, and a length from a circumferential center C2 of the side-surface circumference portion 311a to the side-surface circumference portion 311a in the plan view is defined as a radius R2 of the side-surface circumference portion 311a. Here, a value R2/R1, which is obtained by dividing the radius R2 by the radius R1, preferably satisfies not less than 1.002 and not more than 1.018. In this case, it is possible to prevent a gap between the outer periphery of the substrate 10 and the side-surface circumference portion 311a from becoming excessively large, and it is possible to suppress unintended crystal growth on the lower surface of the substrate 10 caused by the source gases G of the wafer W going around to the lower surface side of the substrate 10.

In the example shown in FIGS. 2 and 3, an orientation flat 101 to indicate crystal orientation of the substrate 10 is formed on the substrate 10. In such a case, the radius R1 of the substrate 10 means a radius of a virtual circle formed when an arc-shaped portion of the rim of the substrate 10 at which the orientation flat 101 is not formed is extended in a circumferential direction of the substrate 10. The same applies when a V-shaped notch, etc., is formed on the substrate 10. The circumferential center C2 is a center of the above-described virtual circle with which the two side-surface circumference portions 311a overlap in the plan view.

In the first embodiment, the side-surface circumference portion 311a is a surface formed in the up-and-down direction. However, the side-surface circumference portion 311a may be, e.g., inclined relative to the up-and-down direction. In such a case, the radius R2 described above means a length in the plan view between the circumferential center C2 and the side-surface circumference portion 311a at a position of an opening edge of the pocket 31 (i.e., a position of the upper edge).

The two side-surface enlarged portions 311b are formed at both ends of the pocket 31 in a rotational direction of the susceptor 3. Here, in the plan view, a virtual straight line passing through the rotational center C1 of the susceptor 3 and the circumferential center C2 of the side-surface circumference portion 311a is defined as a first straight line 11, and a virtual straight line orthogonal to the first straight line 11 and passing through the circumferential center C2 is defined as a second straight line 12, as shown in FIG. 3. The side-surface enlarged portion 311b is formed to overlap the second straight line 12 in the plan view. In addition, in the plan view, a center position of the side-surface enlarged portion 311b in a circumferential direction of the pocket 31 is substantially the same as the position of the second straight line 12. In the first embodiment, the two side-surface enlarged portions 311b are formed line-symmetrical with each other with respect to the first straight line 11.

The side-surface enlarged portion 311b is curved to bulge toward the pocket outer circumferential side and is long in the circumferential direction of the pocket 31. The sum of lengths the two side-surface enlarged portions 311b in the circumferential direction of the pocket 31 is defined as a total length L1, and a circumferential length of the substrate 10 is defined as a circumferential length L2. Here, in FIG. 3, the length of each side-surface enlarged portion 311b in the circumferential direction of the pocket 31 is denoted by L, hence, the value of the total length L1 is 2×L. A value L1/L2 obtained by dividing the total length L1 by the circumferential length L2 preferably satisfies not less than 0.200 and not more than 0.440, more preferably, not less than 0.260 and not more than 0.380. In case that the orientation flat 101 is formed on the substrate 10 as shown in FIGS. 2 and 3, the circumferential length L2 of the substrate 10 means a length of the entire circumference of the virtual circle formed when an arc-shaped portion of the rim of the substrate 10 at which the orientation flat 101 is not formed is extended in the circumferential direction of the substrate 10. The same applies when a V-shaped notch, etc., is formed on the substrate 10.

The sum of lengths the two side-surface circumference portions 311*a* in the circumferential direction of the pocket 31 is defined as a total length L3. A value L1/L3 obtained by dividing the total length L1 of the two side-surface enlarged portions 311*b* in the circumferential direction of the pocket 31 by the total length L3 preferably satisfies not less than 0.300 and not more than 0.600.

Meanwhile, the longest straight-line distance from the circumferential center C2 of the side-surface circumference portion 311*a* to the side-surface enlarged portion 311*b* in the plan view is defined as a radius R3 of the side-surface enlarged portion 311*b*, as shown in FIG. 3. A value R3/R1 obtained by dividing the radius R3 by the radius R1 of the substrate 10 preferably satisfies not less than 1.004 and not more than 1.050, more preferably, not less than 1.004 and not more than 1.031. In addition, a value R3/R2 obtained by dividing the radius R3 by the radius R2 of the side-surface circumference portion 311*a* preferably satisfies not less than 1.002 and not more than 1.030.

A height of the side-surface enlarged portion 311*b* in the up-and-down direction is the same as a height of the side-surface circumference portion 311*a* in the up-and-down direction. In the first embodiment, the side-surface enlarged portion 311*b* is inclined to extend toward the outer circumferential side of the pocket 31 so as to become wider toward the upper side, as shown in FIG. 4. Thus, an angle formed between the side-surface enlarged portion 311*b* and a bottom surface 312 of the pocket 31 is an obtuse angle. Although the side-surface enlarged portion 311*b* is an inclined surface in the first embodiment, it is not limited thereto and it may be, e.g., a curved surface that extends toward the outer circumferential side of the pocket 31 so as to become wider toward the upper side. Alternatively, the side-surface enlarged portion 311*b* may be a surface parallel to the up-and-down direction.

The bottom surface 312 of the pocket 31 is formed to close the lower end of the side surface 311 of the pocket 31. The bottom surface 312 has a flat shape orthogonal to the up-and-down direction. The substrate 10 is placed on the bottom surface 312. The bottom surface 312 can be configured to be non-planar, e.g., configured to be curved so as to bulge toward the lower side, or configured to be stepped such that the diameter varies depending on its position in the up-and-down direction. When a depth of the pocket 31 in the up-and-down direction from a mounting surface for placing the substrate 10 (i.e., the bottom surface 312) to an opening edge of the pocket 31 is defined as a depth D [mm] and a thickness of substrate 10 is defined as a thickness T [mm] as shown in FIG. 4, the depth D of the pocket 31 can be in a range of, e.g., T−0.1≤D≤T+0.5.

As shown in FIG. 1, the rotating shaft 4 is connected to the susceptor 3. The rotating shaft 4 rotates about its central axis, which rotates the susceptor 3. The rotating shaft 4 is connected to a rotating mechanism (not shown) and transmits a rotational force from the rotating mechanism to the susceptor 3. The rotational direction of the rotating shaft 4 and the susceptor 3 is indicated by an arrow on the rotating shaft 4 in FIG. 1, and the rotational direction of the susceptor 3 is indicated by arc-shaped arrows in FIG. 2.

As the heater 5, it is possible to use, e.g., a heater that generates heat when energized. The heater 5 is located below the susceptor 3 and heats the substrate 10 in the pocket 31 through the susceptor 3.

(General Configuration of Nitride Semiconductor Light-Emitting Element 6)

Next, an example of a light-emitting element 6 manufactured using the manufacturing apparatus 1 will be described.

Figure 5:
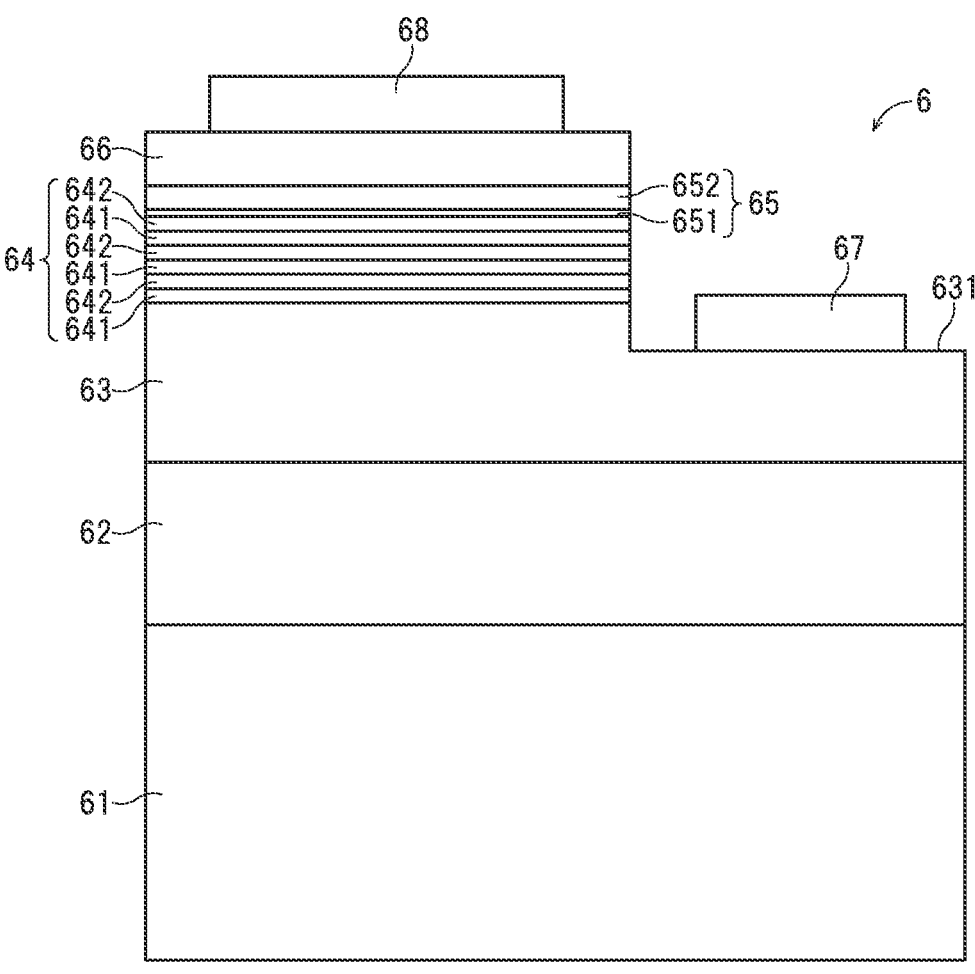
FIG. 5 is a schematic diagram illustrating a configuration of a nitride semiconductor light-emitting element in the first embodiment.

FIG. 5 is a schematic diagram illustrating a configuration of the nitride semiconductor light-emitting element 6 (hereinafter, also referred to as "the light-emitting element 6") manufactured using the wafer W. In FIG. 5, the scale ratio of each semiconductor layer of the light-emitting element 6 is not necessarily the same as the actual scale ratio.

The wafer W is formed using the manufacturing apparatus 1 and is divided in a dicing step (described later), and plural light-emitting elements 6 are thereby obtained from one wafer W. Hereinafter, the substrate when in the state of the wafer W is referred to as the substrate 10, and the substrate when in the state of the light-emitting element 6 after dividing the wafer W is referred to as a substrate 61.

The light-emitting element 6 can be an element constituting, e.g., a light-emitting diode (LED) or a semiconductor laser (LD: Laser Diode). The light-emitting element 6 can be an element constituting a deep ultraviolet LED that emits ultraviolet light at a central wavelength of, e.g., not more than 365 nm. In particular, the light-emitting element 6 in the first embodiment is configured to be capable of emitting, e.g., deep ultraviolet light of not less than 240 nm and not more than 365 nm.

The light-emitting element 6 includes plural semiconductor layers stacked on the substrate 61. In the first embodiment, the plural semiconductor layers stacked on the substrate 61 are a buffer layer 62, an n-type cladding layer 63, an active layer 64, an electron blocking layer 65 and a p-type contact layer 66 in this order from the substrate 61 side. The light-emitting element 6 further includes an n-side electrode 67 formed on the n-type cladding layer 63, and a p-side electrode 68 provided on the p-type contact layer 66.

As semiconductors constituting the light-emitting element 6, it is possible to use, e.g., binary to quaternary group III nitride semiconductors expressed by $Al_xGa_yIn_{1-x-y}N$ ($0 \le x \le 1$, $0 \le y \le 1$, $0 \le x+y \le 1$). In deep ultraviolet LEDs, aluminum gallium nitride (AlGaN)-based semiconductors not including indium are often used. Aluminum gallium nitride-based semiconductors here include aluminum gallium nitride, gallium nitride (GaN), and aluminum nitride (AlN). The group III elements in semiconductors constituting the light-emitting element 6 may be partially substituted with boron (B) or thallium (Tl), etc. In addition, nitrogen (N) may be partially substituted with phosphorus (P), arsenic (As), antimony (Sb) or bismuth (Bi), etc.

The substrate 61 is a sapphire substrate including a sapphire ($Al_2O_3$) single crystal. A thickness of the substrate 61 can be set to not less than 405 μm and not more than 455 μm. In addition to the sapphire substrate, e.g., an aluminum nitride substrate or an aluminum gallium nitride substrate may be used as the substrate 61, but it is preferable to use the sapphire substrate from the viewpoint of suppressing unintended crystal growth on the lower surface of the substrate 61.

The buffer layer 62 is made of aluminum nitride. When the substrate 61 is an aluminum nitride substrate or an aluminum gallium nitride substrate, the buffer layer 62 may not be necessarily included.

The n-type cladding layer 63 is made of aluminum gallium nitride doped with silicon (Si) as an n-type impurity. The n-type cladding layer 63 has an exposed surface 631 partially exposed from the active layer 64 on the upper side. Germanium (Ge), selenium (Se) or tellurium (Te), etc., may alternatively be used as the n-type impurity to dope the n-type cladding layer 63. The same applies to the semiconductor layers containing an n-type impurity other than the n-type cladding layer 63. The n-type cladding layer 63 is a single layer in the first embodiment but may be composed of plural layers.

The active layer 64 includes barrier layers 641 made of aluminum gallium nitride and well layer 642 made of aluminum gallium nitride having a lower Al composition ratio than the aluminum gallium nitride constituting the barrier layers 641. In this regard, the Al composition ratio is also called AlN mole fraction. In the first embodiment, the active layer 64 is formed to have a multiple quantum well structure which includes plural well layers 642. In the first embodiment, the active layer 64 has three barrier layers 641 and three well layers 642 which are alternately stacked. The active layer 64 is arranged in such a manner that the barrier layer 641 is adjacent to the n-type cladding layer 63 and the well layer 642 is adjacent to the electron blocking layer 65. The active layer 64 is configured to have a band gap of not less than 3.4 eV so that ultraviolet light at a wavelength of not more than 365 nm is output. The central wavelength of ultraviolet light emitted from the active layer 64 can be not less than 240 nm and not more than 365 nm, and is preferably not less than 250 nm and not more than 300 nm, further preferably, not less than 260 nm and not more than 290 nm.

When the active layer 64 is formed to have a multiple quantum well structure, the active layer 64 can have various configurations as long as plural well layers 642 are included. In addition, the active layer 64 may be configured to have a single quantum well structure having one well layer 642.

The electron blocking layer 65 is made of p-type aluminum gallium nitride doped with magnesium (Mg) as a p-type impurity. In the first embodiment, the electron blocking layer 65 has a first layer 651 formed on the lower side and a second layer 652 formed on the upper side. The first layer 651 has a higher Al composition ratio than the second layer 652 and a smaller film thickness than the second layer 652. The electron blocking layer 65 serves to improve luminous efficiency of the active layer 64 by suppressing the flow of electrons from the active layer 64 into the p-type contact layer 66. Zinc (Zn), beryllium (Be), calcium (Ca), strontium (Sr), barium (Ba) or carbon (C), etc., may be alternatively used as the p-type impurity. The same applies to the semiconductor layers containing a p-type impurity other than the electron blocking layer 65. In addition, the electron blocking layer 65 is not necessarily limited to a p-type semiconductor layer and may be an undoped semiconductor layer. Furthermore, the electron blocking layer 65 may alternatively be composed of a single layer. Furthermore, the electron blocking layer 65 may not be provided in the light-emitting element 6.

The p-type contact layer 66 is made of p-type gallium nitride doped with a high concentration of impurity such as magnesium. The p-type contact layer 66 may be made of aluminum gallium nitride, and in this case, the Al composition ratio of the aluminum gallium nitride constituting the p-type contact layer 66 is preferably not more than 10%. In addition, at least one p-type cladding layer having an Al composition ratio higher than the p-type contact layer 66 and lower than the electron blocking layer 65 may be formed below the p-type contact layer 66.

The n-side electrode 67 is formed on the exposed surface 631 of the n-type cladding layer 63. The n-side electrode 67 can be made of, e.g., a multilayered film formed by sequentially stacking titanium (Ti), aluminum (Al), titanium and gold (Au) in this order from the lower side, but it is not limited thereto, and it can have any general configuration.

The p-side electrode 68 is formed on the p-type contact layer 66. The p-side electrode 68 can be made of, e.g., a multilayered film formed by sequentially stacking nickel (Ni) and gold in this order from the lower side, but it is not limited thereto, and it can have any general configuration.

(Method for Manufacturing Light-Emitting Element 6)

Next, an example of a method for manufacturing the light-emitting element 6 using the aforementioned manufacturing apparatus 1 will be described. In the method for manufacturing the light-emitting element 6 in the first embodiment, a substrate placement step, a growth step, a region removal step, an electrode formation step and a dicing step are performed sequentially.

In the substrate placement step, the substrates 10 are placed in the pockets 31 of the susceptor 3 of the manufacturing apparatus 1. The substrate 10 may be placed in each of the plural pockets 31, or may be placed only in some of the pockets 31.

In the growth step, the susceptor 3 is heated by the heater 5 and temperature of the substrate 10 is thereby increased to a temperature suitable for the growth of each semiconductor layer to be formed on the substrate 10. As an example, the growth temperature of the buffer layer 62 is not less than 1000° C. and not more than 1400° C., the growth temperature of the n-type cladding layer 63 is not less than 1020° C. and not more than 1180° C., the growth temperatures of the active layer 64 and the electron blocking layer 65 are not less than 1000° C. and not more than 1100° C., and the growth temperature of the p-type contact layer 66 is not less than 900° C. and not more than 1100° C. Then, the susceptor 3 is rotated through the rotating shaft 4 and the source gases G of each semiconductor layer are introduced through the introduction port 21 of the reactor 2. In the growth step, by supplying the source gases G toward the substrate 10 while heating the substrate 10 to a high temperature and rotating the susceptor 3 as described above, each semiconductor layer is epitaxially grown sequentially on the substrate 10 and the wafer W is then finished. As the source gases G to epitaxially grow each semiconductor layer, it is possible to use trimethylaluminum (TMA) as an aluminum source, trimethylgallium (TMG) as a gallium source, ammonia (NH3) as a nitrogen source, tetramethylsilane (TMSi) as a silicon source, and biscyclopentadienylmagnesium (Cp2Mg) as a magnesium source.

Figure 6:
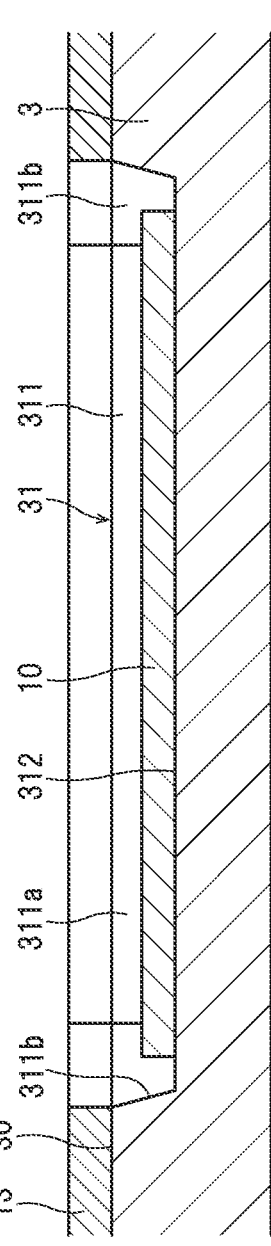
FIG. 6 is a cross-sectional view corresponding to FIG. 4 and showing a state in which a deposit is formed on the susceptor in the first embodiment.

After the growth step is completed, the wafer W is taken out of the susceptor 3. Here, when manufacturing new wafers W, new substrates 10 are subsequently placed in the pockets 31 of the susceptor 3 and the growth step is then performed. At this time, a deposit 13 may be formed on the upper surface 30 of the susceptor 3 due to the source gases G of the wafer W supplied in the previous growth step, as shown in FIG. 6. That is, when growing each semiconductor layer of the wafer W, by introducing the source gases G into the reactor 2, semiconductor layers are deposited on the substrate 10 and at the same time also deposited on the upper surface 30 of the susceptor 3 and form the deposit 13. The deposit 13 is made of an aluminum gallium nitride-bases semiconductor in the same manner as each semiconductor layer of the wafer W. In the first embodiment, the deposit 13 includes at least a layer made of aluminum nitride and a layer made of aluminum gallium nitride, and also includes silicon as an n-type impurity and magnesium as a p-type impurity in appropriate places. The greater the number of the growth steps for growing the wafers W, the greater the thickness of the deposit 13. Although a layer made of p-type gallium nitride is formed in the deposit 13 at the time of forming the p-type contact layer 66 of the wafer W, the layer made of p-type gallium nitride in the deposit layer can be decomposed in the next growth step since p-type gallium nitride has a relatively low decomposition temperature. If the thickness of the deposit 13 becomes more than 230 μm, it is difficult to manufacture the light-emitting element 6 since the deposit 13 comes off during manufacturing the light-emitting element 6 and contaminates the wafer W being manufactured. Therefore, the thickness of the deposit 13 is preferably adjusted to be not more than 230 μm during the growth step by removing the deposit 13 or reducing the thickness of the deposit 13 when the thickness of the deposit 13 becomes more than 230 μm.

In the region removal step, a mask is formed on a portion of an upper surface of the p-type contact layer 66, and the region on which the mask is not formed is removed from the upper surface of the p-type contact layer 66 to a middle of the n-type cladding layer 63. The exposed surface 631 is thereby formed on the n-type cladding layer 63. After forming the exposed surface 631, the mask is removed from the upper surface of the p-type contact layer 66.

In the electrode formation step, the n-side electrode 67 is formed on the exposed surface 631 of the n-type cladding layer 63 and the p-side electrode 68 is formed on the p-type contact layer 66. The n-side electrode 67 and the p-side electrode 68 can be formed by, e.g., a well-known method such as the electron beam evaporation method or the sputtering method.

In the dicing step, the wafer W is diced into individual plural light-emitting elements 6. Plural light-emitting elements 6 as shown in FIG. 5 are thereby formed from one wafer W.

The light-emitting elements 6 are manufactured as described above.

(Functions and Effects of the First Embodiment)

The side surface 311 of the pocket 31 of the susceptor 3 in the first embodiment has the side-surface circumference portions 311a and the side-surface enlarged portions 311b formed to extend toward the pocket outer circumferential side beyond the side-surface circumference portions 311a. In addition, the side-surface enlarged portions 311b are positioned to overlap the second straight line 12 in the plan view. In other word, the side-surface enlarged portions 311b are formed at ends of the pocket 31 in the longitudinal direction of the second straight line 12. As a result, it is possible to achieve uniform in-plane light output distribution in the wafer W manufactured using the susceptor 3 in the first embodiment. Details about this will be described below.

Figure 7:
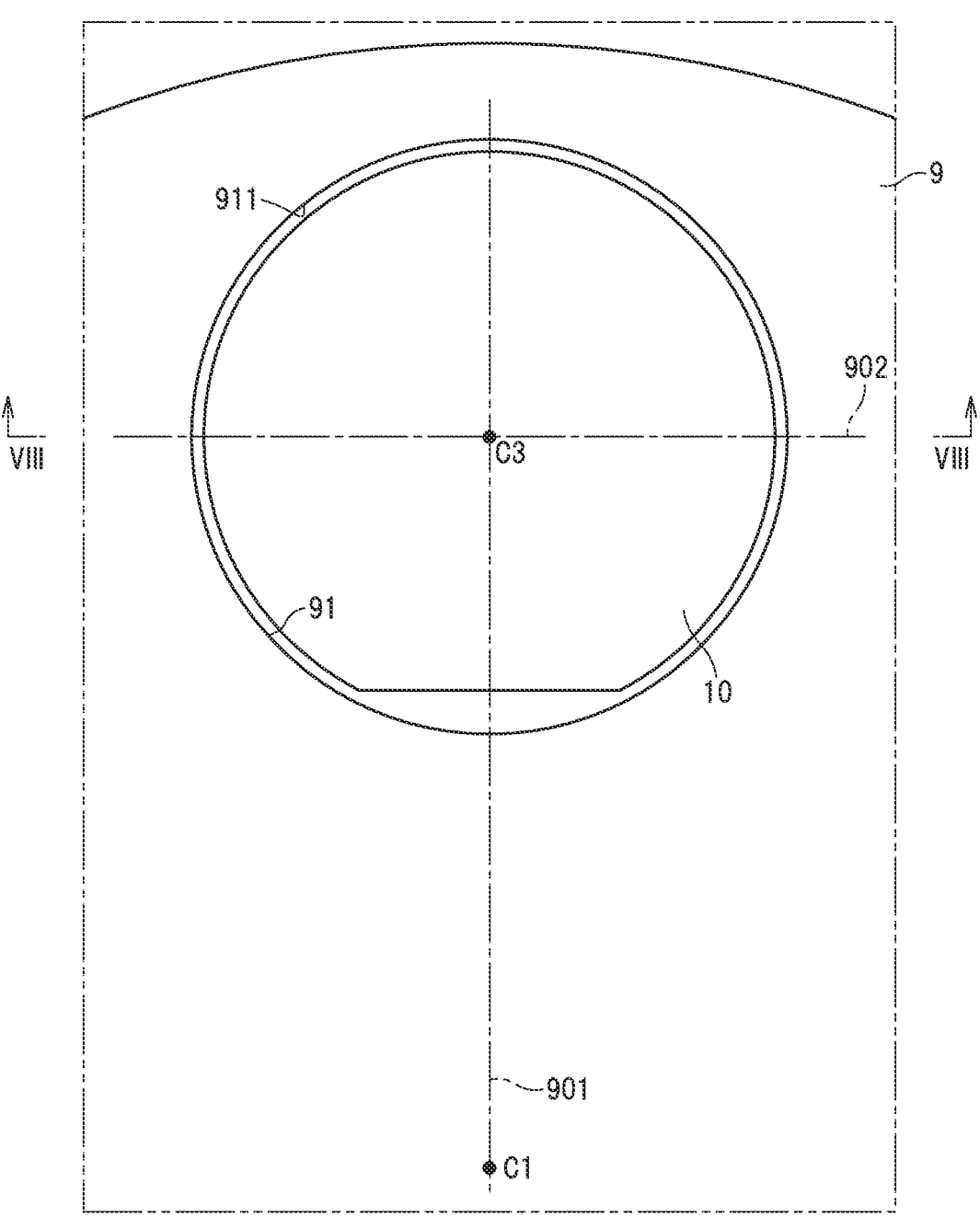
FIG. 7 is an enlarged plan view showing a portion of a susceptor in Comparative Example and the substrate.
Figure 8:
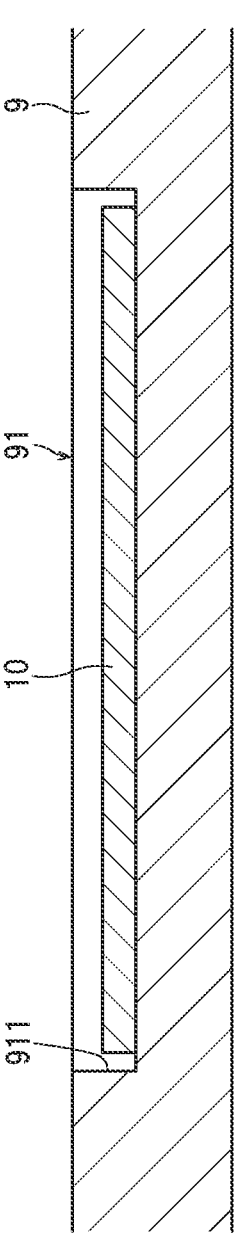
FIG. 8 is a cross-sectional view taking along line VIII-VIII of FIG. 7, as viewed in an arrow direction.

Firstly, using FIGS. 7 and 8, a susceptor 9 in Comparative Example will be examined. FIG. 7 is an enlarged plan view showing a portion of the susceptor 9 in Comparative Example and the substrate 10. FIG. 8 is a cross-sectional view taking along line VIII-VIII of FIG. 7, as viewed in an arrow direction. The susceptor 9 in Comparative Example is configured such that a side surface 911 of a pocket 91 does not have the side-surface enlarged portion 311b as described above and is formed in a circular shape. In the description of Comparative Example, the same constituent elements, etc., as those described in the first embodiment will be denoted by the same reference signs as those used in the first embodiment and the explanation thereof will be omitted. In addition, in Comparative Examples, a straight line connecting the rotational center C1 of the susceptor 9 and a center C3 of the circular side surface 911 in the plan view is defined as a first straight line 901, and a straight line orthogonal to the first straight line 901 and passing through the center C3 is defined as a second straight line 902, as shown in FIG. 7.

Wafers manufactured using the susceptor 9 in Comparative Example tend to have lower light output at both ends in the longitudinal direction of the second straight line 902. This is quantitatively shown in Experiment Example described below. When manufacturing wafers using the susceptor 9 in Comparative Example, both ends of the substrate 10 in the longitudinal direction of the second straight line 902 are likely to receive heat from the side surface 911 of the pocket 91 and to be heated to high temperature. Furthermore, when the susceptor 9 is rotated during manufacturing of wafers, the source gases do not easily reach the substrate 10 in the vicinity of both ends of the substrate 10 in the longitudinal direction of the second straight line 902. It is presumed that these cause the wafer to have lower light output at both ends in the longitudinal direction of the second straight line 902.

Based on such presumption, the side-surface enlarged portions 311b were formed on the side surface 311 of the pocket 31 as in the susceptor 3 of the first embodiment, and it has been confirmed that it is possible to achieve uniform in-plane light output distribution in the wafer W manufactured using the susceptor 3. This is quantitatively shown in Experiment Example described below.

In addition, particularly when the thickness of the deposit 13 shown in FIG. 6 is larger, heat dissipation from the upper surface 30 of the susceptor 3 decreases and particularly the rim portion of the substrate 10 is likely to be heated to high temperature, and in-plane light output distribution in the wafer W to be manufactured tends to be non-uniform. Therefore, the effect of providing the side-surface enlarged portion 311b is larger when the deposit 13 is thicker (e.g., not less than 140 μm).

In addition, the side surface 311 of the pocket 31 has two side-surface enlarged portions 311b that are formed on both sides of the pocket 31 in the rotational direction of the susceptor 3. Although the details will be described later in reference to Experiment Example, wafers manufactured using the susceptor 9 in Comparative Example shown in FIGS. 7 and 8 have lower light output at both ends in the longitudinal direction of the second straight line 902. Therefore, the side surface 311 of the pocket 31 has the side-surface enlarged portions 311b on both sides of the pocket 31 in the rotational direction of the susceptor 3, and it is thereby possible to achieve uniform in-plane light output distribution in the wafer W manufactured using the susceptor 3.

In addition, the two side-surface enlarged portions 311b are formed line-symmetrical with respect to the first straight line 11. This allows the two side-surface enlarged portions 311b to be easily formed on the pocket 31. It is also possible to manufacture the wafer W with uniform quality regardless of the rotational direction of the susceptor 3.

In addition, the side-surface enlarged portion 311b is formed to extend toward the pocket outer circumferential side so as to become wider toward the open side of the pocket 31. Therefore, it is easy to suppress stagnation of the source gases G in a space on the pocket inner circumferential side of the side-surface enlarged portion 311b. If the source gases G stagnates in the space on the pocket inner circumferential side of the side-surface enlarged portion 311b, the crystal grows differently in the area facing the side-surface enlarged portion 311b and other areas on the wafer W, and the in-plane light output distribution in the wafer W is likely to be non-uniform. On the other hand, in the first embodiment, it is possible to suppress stagnation of the source gases G in the space on the pocket inner circumferential side of the side-surface enlarged portion 311b since the side-surface enlarged portion 311b is formed to extend toward the pocket outer circumferential side so as to become wider toward the open side of the pocket 31, and as a result, it is possible to achieve more uniform in-plane light output distribution in the wafer W to be manufactured.

In addition, the value L1/L2 obtained by dividing the total length L1 of the two side-surface enlarged portions 311b in the circumferential direction of the pocket 31 by the circumferential length L2 of the substrate 10 satisfies not less than 0.200 and not more than 0.440. When the value L1/L2 is not less than 0.200, the region of the substrate 10 which faces the side-surface enlarged portion 311b when the substrate 10 is placed in the pocket 31 can be sufficiently large in the circumferential direction of the pocket 31, which facilitates to achieve more uniform in-plane light output distribution. Meanwhile, when the value L1/L2 is not more than 0.440, excessive inflow of the source gases G into the pocket 31 can be suppressed and unintended crystal growth on the lower surface of the substrate 10 can be suppressed. If unintended crystal growth on the lower surface of the substrate 10 occurs, desired light output, etc. may not be obtained in a portion of the wafer W. However, by setting the value L1/L2 to not more than 0.440 as in the first embodiment, it is possible to achieve more uniform in-plane light output distribution in the wafer W. From the same point of view, the value L1/L2 more preferably satisfies not less than 0.260 and not more than 0.380.

In addition, the value R3/R1 obtained by dividing the radius R3 of the side-surface enlarged portion 311b by the radius R1 of the substrate 10 satisfies not less than 1.004 and not more than 1.050. When the value R3/R1 is not less than 1.004, it is possible to provide a sufficiently large distance between the side-surface enlarged portion 311b and the wafer W. Therefore, for the wafer W manufactured using the susceptor 3, light output in the area near the side-surface enlarged portion 311b is easily increased. Meanwhile, when the value R3/R1 is not more than 1.050, excessive inflow of the source gases G into the pocket 31 can be suppressed. This suppresses unintended crystal growth on the lower surface of the substrate 10, resulting in more uniform in-plane light output distribution in the wafer W to be manufactured. From the same point of view, the value R3/R1 more preferably satisfies not less than 1.004 and not more than 1.031.

As described above, according to the first embodiment, it is possible to provide a susceptor and a method for manufacturing a nitride semiconductor light-emitting element that allow to achieve uniform in-plane light output distribution in a wafer to be manufactured.

EXPERIMENT EXAMPLE

In this example, in-plane light output distribution was compared between a wafer in Example manufactured using the susceptor 3 of the first embodiment shown in FIGS. 1 to 4 and a wafer in Comparative Example manufactured using the susceptor 9 in Comparative Example shown in FIGS. 7 and 8. The susceptor used to manufacture the wafer in Example and the susceptor used to manufacture the wafer in Comparative Example had the same configuration, except for the presence or absence of the side-surface enlarged portion.

In this Experiment Example, each of the wafer in Example and the wafer in Comparative Example was caused to emit light in the state of wafer, and light output was measured at every position in the longitudinal direction of the second straight line (see the reference sign 12 in FIG. 3 and the reference sign 902 in FIG. 7). Plural light-emitting elements formed on a wafer may have different light outputs also depending on the position in the longitudinal direction of the first straight line (see the reference sign 11 in FIG. 3 and the reference sign 901 in FIG. 7), hence, light output of the wafer at each position in the longitudinal direction of the second straight line here is the average of the light outputs of the plural light-emitting elements that exist at that position and are aligned in the longitudinal direction of the first straight line.

Figure 9:
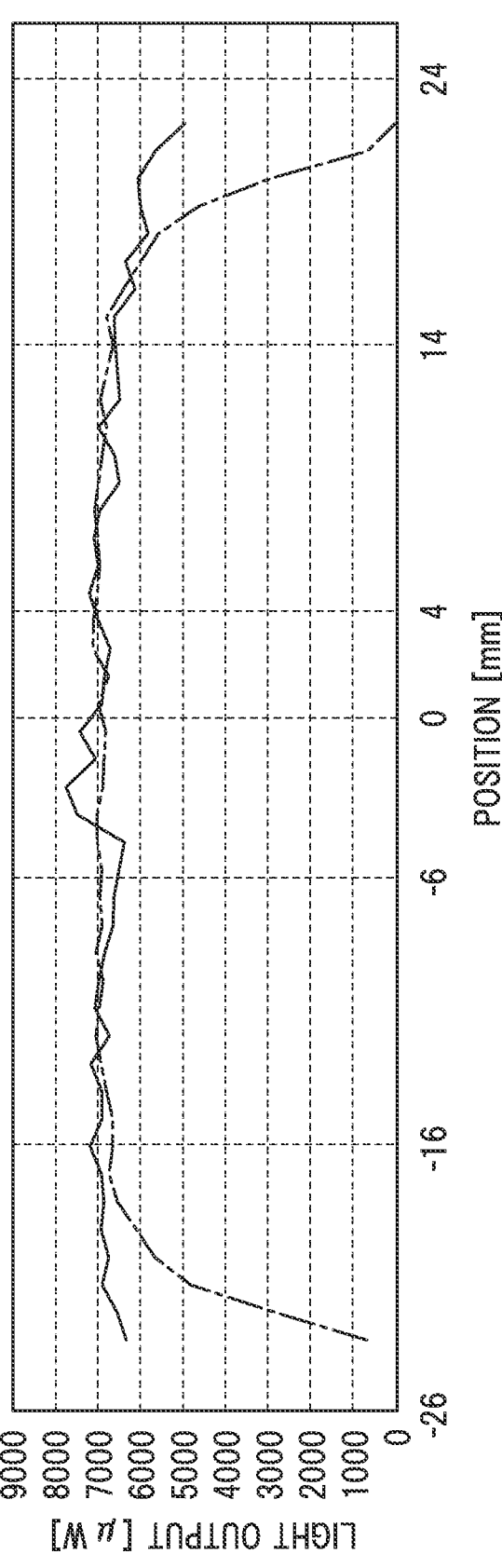
FIG. 9 is a graph obtained in Experiment Example and showing experimental results of in-plane distribution in a wafer in Example and a wafer in Comparative Example.

In this Experiment Example, a drive current of 100 mA was supplied to each of the wafer in Example and the wafer in Comparative Example, and light output at each position in the longitudinal direction of the second straight line was measured on each wafer. The results are shown in FIG. 9. The horizontal axis of the graph shown in FIG. 9 indicates the position on the wafer in the longitudinal direction of the second straight line, where the position of 0 mm is the wafer center position, the position with a positive sign indicates the position away from the wafer center position on the side toward which the susceptor rotates, and the position with a negative sign indicates the position away from the wafer center position on the side opposite to the side toward which the susceptor rotates. In this Experiment Example, the substrates constituting the wafers in Example and Comparative Example have a radius of 25.40 mm. In FIG. 9, the result in Comparative Example is indicated by a dash-dot-dash line and the result in Example is indicated by a solid line.

As shown in FIG. 9, in Comparative Example, light output is lower at the positions of both ends of the wafer in the longitudinal direction of the second straight line. On the other hand, in Example, light output of the wafer is stable at each position in the longitudinal direction of the second straight line.

The above shows that it is possible to achieve uniform in-plane light output distribution in the wafer by providing the side-surface enlarged portions on the pocket of the susceptor as in the first embodiment.

Second Embodiment

Figure 10:
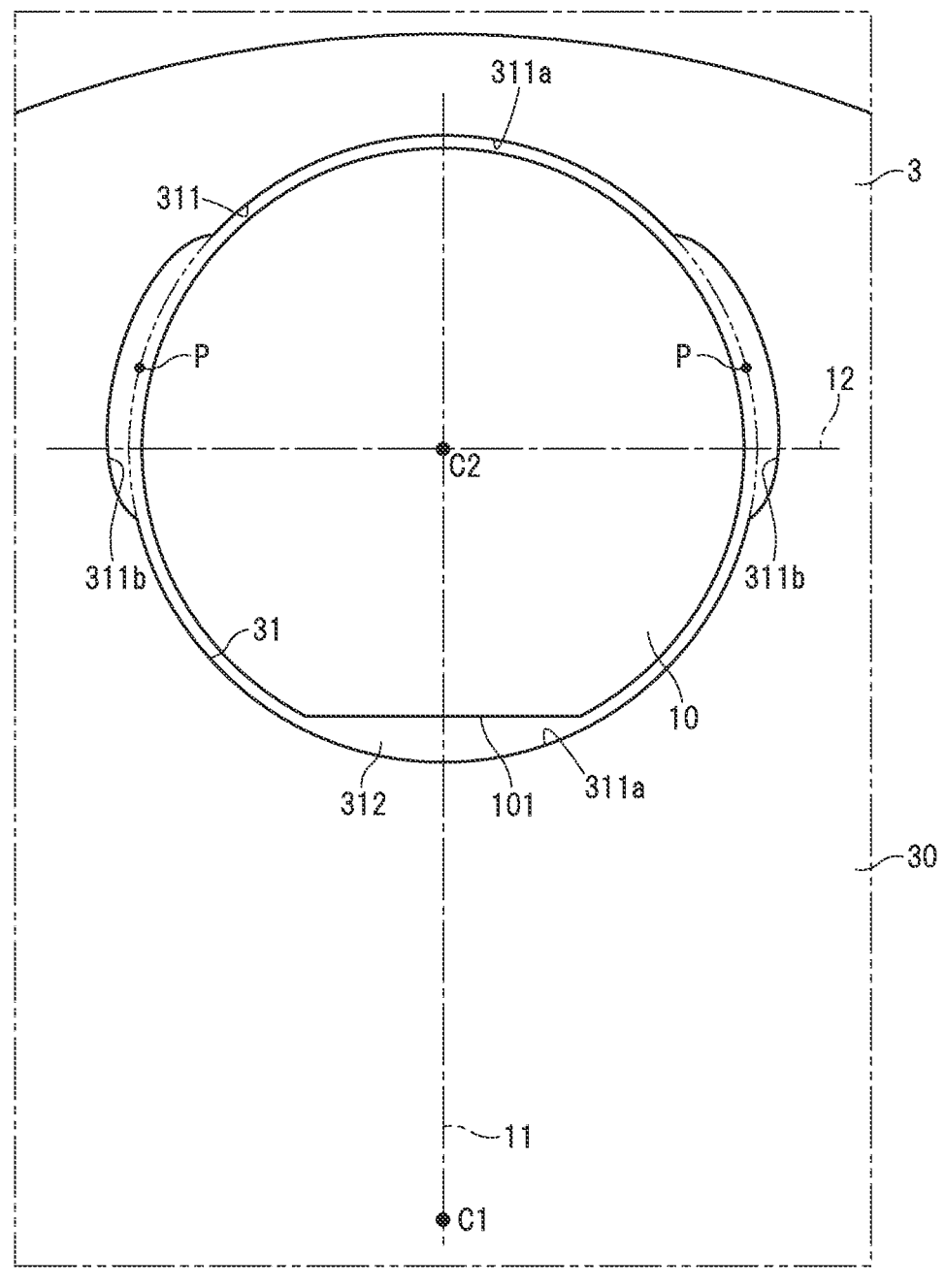
FIG. 10 is an enlarged plan view showing a portion of the susceptor in the second embodiment and the substrate.

FIG. 10 is an enlarged plan view showing a portion of the susceptor 3 in the second embodiment and the substrate 10.

In the second embodiment, the formation positions of the two side-surface enlarged portions 311b on the pocket 31 are changed from the first embodiment. In the second embodiment, a center position P of the side-surface enlarged portion 311b in the circumferential direction of the pocket 31 is located on the susceptor outer circumferential side relative to the second straight line 12. Thus, in the plan view, a portion of the side-surface enlarged portion 311b on the susceptor inner circumferential side relative to the center position P in the circumferential direction of the pocket 31 overlaps the second straight line 12.

The other configurations are the same as in the first embodiment.

Among the reference signs used in the second embodiment, the same reference signs as those used in the already-described embodiment indicate the same constituent elements, etc., as those in the already-described embodiment, unless otherwise specified.

Functions and Effects of the Second Embodiment

It has been confirmed that when manufacturing a wafer using the susceptor 9 in Comparative Example shown in FIGS. 7 and 8, the manufactured wafer has lower light output particularly at portions on the susceptor outer circumferential side in the areas at both ends in the longitudinal direction of the second straight line 902. The followings are presumed to be the causes. Firstly, during the growth step, centrifugal force caused by rotation of the susceptor 9 pushes the substrate 10 against a portion of the side surface 911 of the pocket 91 on the susceptor outer circumferential side, and a distance between a portion of the substrate 10 on the susceptor outer circumferential side and the side surface 911 of the pocket 91 is reduced. As a result, a portion on the susceptor outer circumferential side in the areas at both ends of the substrate 10 in the longitudinal direction of the second straight line 902 is likely to receive heat from the side surface 911 of the pocket 91, and in addition to this, the source gases do not easily reach particularly a portion of the peripheral edge of the substrate 10 on the susceptor outer circumferential side. It is presumed that this results in a decrease in light output at portions on the susceptor outer circumferential side in the areas at both ends of the wafer in the longitudinal direction of the second straight line 902.

Thus, by forming the side-surface enlarged portion 311*b* so that its center position P in the circumferential direction of the pocket 31 is located on the susceptor outer circumferential side relative to the second straight line 12 as on the susceptor 3 of the second embodiment, it is possible to achieve more uniform in-plane light output distribution in the wafer W to be manufactured.

The other functions and effects are the same as in the first embodiment.

Summary of the Embodiments

Technical ideas understood from the embodiments will be described below citing the reference signs, etc., used for the embodiments. However, each reference sign, etc., described below is not intended to limit the constituent elements in the claims to the members, etc., specifically described in the embodiments.

[1] The first aspect of the invention is a susceptor (3), comprising: a pocket (31) in which a wafer (W) is placed, wherein a side surface (311) of the pocket (31) comprises a side-surface circumference portion (311*a*) formed in a circumference shape and a side-surface enlarged portion (311*b*) formed to extend toward an outer circumferential side of the pocket (31) beyond the side-surface circumference portion (311*a*), and wherein in a plan view seen from an open side of the pocket (31), when a straight line passing through a rotational center (C1) of the susceptor (3) and a circumferential center (C2) of the side-surface circumference portion (311*a*) is defined as a first straight line (11) and a straight line orthogonal to the first straight line (11) and passing through the circumferential center (C2) is defined as a second straight line (12), the side-surface enlarged portion (311*b*) overlaps the second straight line (12).

It is thereby possible to achieve uniform in-plane light output distribution in the wafer manufactured using the susceptor.

[2] The second aspect of the invention is that, in the first aspect, a center position (P) of the side-surface enlarged portion (311*b*) in a circumferential direction of the pocket (31) is located on an outer circumferential side of the susceptor (3) relative to the second straight line (12).

It is thereby possible to achieve more uniform in-plane light output distribution in the wafer manufactured using the susceptor.

[3] The third aspect of the invention is that, in the first or second aspect, the side surface (311) of the pocket (31)

comprises two said side-surface enlarged portions (311*b*) that are formed on both sides of the pocket (31) in a rotational direction of the susceptor (3).

It is thereby possible to achieve more uniform in-plane light output distribution in the wafer manufactured using the susceptor.

[4] The fourth aspect of the invention is that, in the third aspect, the two side-surface enlarged portions (311*b*) are line symmetric with respect to the first straight line (11).

It is thereby possible to manufacture the wafer with uniform quality regardless of the rotational direction of the susceptor.

[5] The fifth aspect of the invention is that, in any one of the first to fourth aspects, the side-surface enlarged portion (311*b*) is formed to extend toward the outer circumferential side of the pocket (31) so as to become wider toward the open side of the pocket (31).

It is thereby possible to achieve more uniform in-plane light output distribution in the wafer manufactured using the susceptor.

[6] The sixth aspect of the invention is a method for manufacturing a nitride semiconductor light-emitting element (6) using the susceptor (3) in any one of the first to fifth aspects, the method comprising: placing a substrate (10) in the pocket (31); and epitaxially growing a semiconductor layer comprising a nitride semiconductor on the substrate (10) while heating and rotating the susceptor (3).

It is thereby possible to achieve uniform in-plane light output distribution in the wafer manufactured using the susceptor.

[7] The seventh aspect of the invention is that, in the sixth aspect, the side surface (311) of the pocket (31) comprises two said side-surface enlarged portions (311*b*) that are formed on both sides of the pocket (31) in a rotational direction of the susceptor (3), and wherein a value obtained by dividing a sum of lengths of the two side-surface enlarged portions (311*b*) in the circumferential direction of the pocket (31) by a circumferential length of the substrate (10) satisfies not less than 0.200 and not more than 0.440.

It is thereby possible to achieve more uniform in-plane light output distribution in the wafer manufactured using the susceptor.

[8] The eighth aspect of the invention is that, in the sixth or seventh aspect, a value obtained by dividing a longest straight-line distance (R3) from the circumferential center (C2) to the side-surface enlarged portion (311*b*) in the plan view seen from the open side of the pocket (31) by a radius (R1) of the substrate (10) satisfies not less than 1.004 and not more than 1.050.

It is thereby possible to achieve more uniform in-plane light output distribution in the wafer manufactured using the susceptor.

(Additional Note)

Although the embodiments of the invention have been described, the invention according to claims is not to be limited to the embodiments described above. Further, please note that not all combinations of the features described in the embodiments are necessary to solve the problem of the invention. In addition, the invention can be appropriately modified and implemented without departing from the gist thereof.

For example, although the example in which the side surface of the pocket has two side-surface enlarged portions has been described in each of the embodiments, it is not limited thereto and it may have one side-surface enlarged portion. In addition, in each of the embodiments, the side surface of the pocket may be configured such that a surface formed to extend toward the pocket outer circumferential side beyond the side-surface circumference portion is located at a position not overlapping the second straight line in the plan view. In addition, although the example in which the side-surface enlarged portion is formed in a curved shape has been described in each of the embodiments, it is not limited thereto and it may have, e.g., a bent shape along three of four sides of a quadrangle.

REFERENCE SIGNS LIST

10 SUBSTRATE
11 FIRST STRAIGHT LINE
12 SECOND STRAIGHT LINE
3 SUSCEPTOR
31 POCKET
311 SIDE SURFACE
311*a* SIDE-SURFACE CIRCUMFERENCE PORTION
311*b* SIDE-SURFACE ENLARGED PORTION
6 NITRIDE SEMICONDUCTOR LIGHT-EMITTING ELEMENT
C1 ROTATIONAL CENTER
C2 CIRCUMFERENTIAL CENTER
P CENTER POSITION OF SIDE-SURFACE ENLARGED PORTION
R1 RADIUS OF SUBSTRATE
R3 LONGEST STRAIGHT-LINE DISTANCE
The invention claimed is:

1. A method for manufacturing a nitride semiconductor light-emitting element using a susceptor, comprising a pocket in which a wafer is placed, wherein a side surface of the pocket comprises a side-surface circumference portion formed in a circumference shape and two side-surface enlarged portions formed on both sides of the pocket in a rotational direction of the susceptor, each side-surface enlarged portion being formed to extend toward an outer circumferential side of the pocket beyond the side-surface circumference portion, wherein in a plan view seen from an open side of the pocket, when a straight line passing through a rotational center of the susceptor and a circumferential center of the side-surface circumference portion is defined as a first straight line and a straight line orthogonal to the first straight line and passing through the circumferential center is defined as a second straight line, the side-surface enlarged portion overlaps the second straight line, and wherein the two side-surface enlarged portions are line symmetric with respect to the first straight line, the method comprising:

placing a substrate in the pocket; and epitaxially growing a semiconductor layer comprising a nitride semiconductor on the substrate while heating and rotating the susceptor, wherein a value obtained by dividing a sum of lengths of the two side-surface enlarged portions in the circumferential direction of the pocket by a circumferential length of the substrate satisfies not less than 0.200 and not more than 0.440.

2. The method according to claim 1, wherein a value obtained by dividing a longest straight-line distance from the circumferential center to the side-surface enlarged portion in the plan view seen from the open side of the pocket by a radius of the substrate satisfies not less than 1.004 and not more than 1.050.

* * * * *